United States Patent [19]

Eggers

[11] Patent Number: 4,510,678

[45] Date of Patent: Apr. 16, 1985

[54] METHOD FOR MANUFACTURING A MONOLITHICALLY INTEGRABLE CIRCUIT WITH A MULTILAYER WIRING STRUCTURE

[75] Inventor: Harald Eggers, Munich, Fed. Rep. of Germany

[73] Assignee: Siemens Aktiengesellschaft, Berlin and Munich, Fed. Rep. of Germany

[21] Appl. No.: 518,144

[22] Filed: Jul. 28, 1983

[30] Foreign Application Priority Data

Jul. 29, 1982 [DE] Fed. Rep. of Germany ....... 3228399

[51] Int. Cl.³ .................. H01L 21/90; H01L 21/94
[52] U.S. Cl. .................................... 29/590; 29/591; 204/192 D; 357/71; 427/38; 427/93; 427/94; 427/95
[58] Field of Search ............... 29/589, 590, 591; 204/192 S, 192 D; 357/71; 427/38, 93, 94, 95

[56] References Cited

U.S. PATENT DOCUMENTS 4,381,595  5/1983  Denda et al. ...................... 29/589
4,419,385 12/1983  Deters ............................. 427/93 X

OTHER PUBLICATIONS

Homma, Y., "Polyimide Liftoff Technology for High Density LSI Metallization" in *IEEE Trans. on Electron Devices*, vol-Ed 28, No. 5, May 81, pp. 552-556.

Primary Examiner—Brian E. Hearn
Assistant Examiner—Alan E. Schiavelli
Attorney, Agent, or Firm—Herbert L. Lerner; Laurence A. Greenberg

[57] ABSTRACT

A method of manufacturing a monolithically integrable circuit, which includes depositing an SiO₂ layer on the surface of a semiconductor substrate containing p-n junctions of the circuit, at least partially covering the SiO₂ layer with a first metallization supported by the SiO₂ layer and containing conductor runs and electrodes capacitively coupled to the surface of the semiconductor substrate through the SiO₂ layer, directly covering the first metallization with a sputtered-on SiO₂ insulating layer after the first metallization is completed, covering the sputtered-on SiO₂ layer with a further inorganic insulating layer generated by the plasma method, structuring the further inorganic insulating layer and the sputtered-on SiO₂ layer, forming cutouts in the further inorganic insulating layer and the sputtered-on SiO₂ layer above intended contact locations of the first metallization, applying a second metallization to the surface of the further inorganic insulating layer after completing the first metallization, the sputtered-on SiO₂ layer and the further inorganic insulating layer, bringing the second metallization into electrical contact with the contact locations of the first metallization through the cutouts, and forming the second metallization into conductor runs.

5 Claims, 3 Drawing Figures

METHOD FOR MANUFACTURING A MONOLITHICALLY INTEGRABLE CIRCUIT WITH A MULTILAYER WIRING STRUCTURE

SUMMARY OF THE INVENTION

The invention relates to a method for manufacturing a monolithically integrable circuit, which includes providing an $SiO_2$ layer on the surface of the semiconductor substrate which contains the p-n junctions of the circuit and is preferable formed of monocrystalline silicon, the $SiO_2$ layer being used as a support for a first metallization represented by conductor runs and electrodes capacitively coupled to the surface of the semiconductor substrate through the $SiO_2$ layer; completing the first metallization, subsequently covering the first metallization with an insulating layer of sputtered-on $SiO_2$; completing the insulating layer supported by the first metallization and subsequently applying a second metallization to the surface of the first metallization and the insulating layer, bringing the second metallization into electrical contact with locations of the first metallization intended for contact by forming cutouts in the insulating layer, and finally forming the second metallization into electric conductor runs. The substrate may be monocrystalline.

Such methods are generally customary. The integrated circuits produced by these methods are called "two-layer wired" ICs or, if several planar metallization surfaces are used, they are called "multilayer wired" ICs.

In the fabrication of such integrated circuits, the preparation of the second and further planar metallization surfaces is noticeably more critical than the preparation of the first planar metallization surface which is closest to the surface of the semiconductor substrate. This manifests itself by making rejects caused by defects in the metallization far more frequent in the second planar metallization surface and in possibly existing further planar metallization surfaces which (with the exception of intended connecting points) are separated from each other by insulating layers, than such defects are in the first planar metallization surface. Mainly two failure phenomena are responsible, namely the occurence of tears and pinholes in the second layer. These will be explained in greater detail below by making reference to the figures.

It is accordingly an object of the invention to provide a method for manufacturing a monolithically integrable circuit, which overcomes the hereinafore-mentioned disadvantages of the heretofore-known methods of this general type.

With the foregoing and other objects in view there is provided, in accordance with the invention, a method of manufacturing a monolithically integrable circuit, which comprises depositing an $SiO_2$ layer on the surface of a semiconductor substrate containing p-n junctions of the circuit, at least partially covering the $SiO_2$ layer with a first metallization supported by the $SiO_2$ layer and containing conductor runs and electrodes capacitively coupled to the surface of the semiconductor substrate through the $SiO_2$ layer, directly covering the first metallization with a sputtered-on $SiO_2$ insulating layer after the first metallization is completed, covering the sputtered-on $SiO_2$ layer with a further inorganic insulating layer generated by the plasma discharge method, structuring the further inorganic layer and the sputtered-on $SiO_2$ layer, forming cutouts in the further inorganic insulating layer and the sputtered-on $SiO_2$ layer above intended contact locations of the first metallization, applying a second metallization to the surface of the further inorganic insulating layer after completing the first metallization, the sputtered-on $SiO_2$ layer and the further inorganic insulating layer, bringing the second metallization into electrical contact with the contact locations of the first metallization through the cutouts, and forming the second metallization into conductor runs.

In accordance with another mode of the invention, there is provided a method which comprises forming the further insulating layer of silicon nitride or silicon dioxide.

In accordance with a concomitant mode of the invention, there is provided a method which comprises forming the sputtered-on insulating layer at least 0.6 $\mu m$ thick and the further insulating layer at least 0.7 $\mu m$ thick.

Other features which are considered as characteristic for the invention are set forth in the appended claims.

Although the invention is illustrated and described herein as embodied in a method for manufacturing a monolithically integrable circuit, it is nevertheless not intended to be limited to the details shown, since various modifications and structural changes may be made therein without departing from the spirit of the invention and within the scope and equivalents of the claims.

BRIEF DESCRIPTION OF THE DRAWINGS

The construction and method of operation of the invention, however, together with additional objects and advantages thereof will be best understood from the following description of specific embodiments when read in connection with the accompanying drawing, in which.

DETAILED DESCRIPTION

Figure 1:
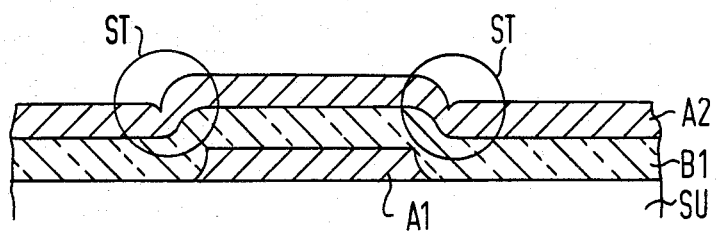
FIG. 1 is a fragmentary, diagrammatic, cross-sectional view of a multilayer semiconductor device, which is an example of a first defect phenomenon.

Referring now to the figures of the drawing in detail and first particularly to FIG. 1 thereof, there is seen an illustration of the first defect phenomenon to be discussed. This phenomenon relates to tears and the interruption which they cause in conductor runs in the second planar metallization surface and, if applicable, in a third planar metallization surface. Such interruptions occur at points where conductor runs A2 of the second planar metallization surface (or a third planar metallization surface which is even more distant from the substrate surface) cross a conductor run A1 of the first planar metallization surface (or of another planar metallization surface disposed between the planar metallization surface under consideration and the substrate surface).

The geometric disposition of the layers is shown in FIG. 1. The lower conductor run A1 is covered by an intermediate dielectric layer B1 which forms the support of the next planar metallization surface and therefore forms the support of the conductor run A2 which belongs to the next metallization surface, and crosses the lower conductor run A1. As experience shows, the edge of the conductor run A1 belonging the the lower planar metallization surface (i.e., the first planar metallization surface) can lead to constrictions of the crossing conductor run A2 (belonging to the second planar metallization surface), which can then lead very quickly to a failure of the conductor run A2 and a consequent failure of the integrated semiconductor circuit. In FIG. 1 and in FIGS. 2 and 3, reference symbol SU indicates the semiconductor substrate which is covered by an $SiO_2$ layer forming the first planar metallization surface, and reference symbol A1 indicates a conductor run belonging to the first metallization surface. The conductor run A1, together with the other conductor runs belonging to the first planar metallization surface, is separated by an insulating layer B1 from conductor runs A2 of the second planar metallization surface. (In this connection, reference may be made to the publication "Der Elektroniker", 6-1982, p. 49, FIG. 2.49). The conductor runs are formed of a metal which is customary for this purpose, especially aluminum, and the insulating layer B1 may be formed of $SiO_2$.

As may now be seen from FIG. 1, the edge of the conductor run A1 belonging to the first planar metallization surface can lead to noticeable constrictions at areas ST of the crossing conductor run A2 which belongs to the second planar metallization surface, the areas ST being located on top of the first planar metallization surface. These constrictions of the conductor run A2 then very quickly lead to an interruption of the conductor run and thereby to its failure, which results in a failure of the entire integrated circuit.

Figure 2:
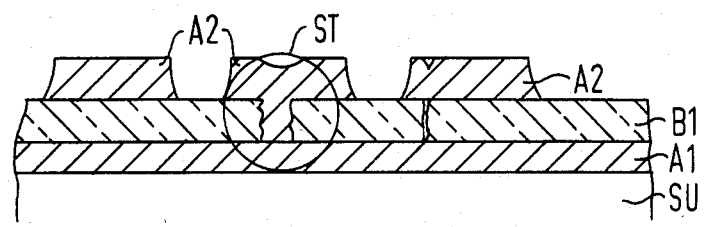
FIG. 2 is a view similar to FIG. 1 of a device which is an example of a second defect phenomenon.

The second source of defects to be discussed are short circuits between two crossing conductor runs belonging to two adjacent planar metallization surfaces, which are due to unintended holes and other defects in the dielectric separating layer provided between the two conductor runs A1 and A2. These defects are illustrated in FIG. 2. Either sputtered-on $SiO_2$ or so-called plasma nitride ($Si_xN_y$) is customarily used as the material for the dielectric layer B1 provided between the adjacent planar metallization surface and therefore between the two planar conductor surfaces A1 and A2. The term "plasma nitride" means that this layer was applied by means of a suitable plasma gas discharge.

An advantage of using sputtered-on $SiO_2$ for the intermediate dielectric B1 is that the sputtered-on oxide has the tendency to lead to a flattening-out of the topology on the outside of the insulating layer B1, which reduces the danger of the failure phenomenon illustrated by means of FIG. 1. This flattening-out effect does not occur, however, if the insulating layer B1 forming the intermediate dielectric is generated and applied by means of a plasma discharge.

It is, however, a substantial disadvantage of using a sputtered-on layer for the intermediate dielectric B1 that in such a layer there are a great many defects (pinholes) which can lead to the above-mentioned second source of defects shown in FIG. 2. In addition, long etching periods are required when structuring the dielectric intermediate layer B1 (which must be performed, in particular, by means of a photoresist etching technique using a chemical etchant or using plasma etching), which serves for generating the above-mentioned contact holes extended to the first planar metallization surface (or the semiconductor surface), if the dielectric intermediate layer is generated by sputtering.

It is a disadvantage of using a dielectric intermediate layer B1 generated by a plasma discharge, that the edges of the metallization lying underneath, i.e., the conductor runs A1, are as noticeable as before through the intermediate layer B1 as the source of defects shown in FIG. 1, so that the subsequent metallization process must cover steep steps at the surface of the dielectric intermediate layer B1, which leads to a reduction of the yield.

Figure 3:
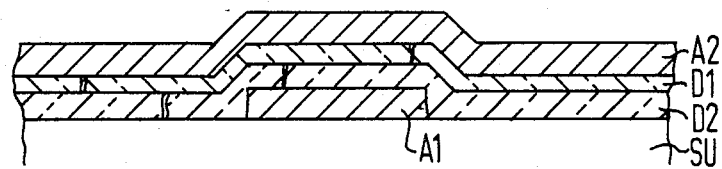
FIG. 3 is another view similar to FIGS. 1 and 2 of a device according to the invention for eliminating the defect phenomena.

As seen in FIG. 3, the above-mentioned disadvantages are eliminated according to the invention in a method of the type mentioned above, in which an insulating layer D2 which is formed of sputtered-on $SiO_2$, is applied directly on the first metallization A1 after first being covered with a further inorganic insulating layer D1 generated by means of the plasma method. After the further inorganic insulating layer D1 is structured, together with the sputtered-on $SiO_2$ layer D2, the second metallization A2 is applied on this inorganic insulating layer D1, and the second metallization A2 is formed in the manner required in each case.

The further insulating layer D1 applied by the plasma discharge method, may likewise be formed of $SiO_2$ in a first embodiment of the method according to the invention. Another advantageous possibility is seen in using silicon nitride as the material for the further insulating layer D1, while the insulating layer underneath is always formed of sputtered-on $SiO_2$. A further possibility for the further insulating layer D2 would be the use of $Al_2O_3$. Obviously, the two partial layers D1 and D2 together form a dielectric intermediate layer, having a geometric structure which corresponds to the dielectric intermediate layer B1, and having cutouts therein for bringing the second metallization A2 into contact with intended contact locations of the first metallization A1.

Since the tendency for flattening-out the surface of a sputtered-on $SiO_2$ layer takes effect very quickly, it is sufficient if the minimum thickness of the sputtered-on partial layer D2 is about 0.7 $\mu$m. The outer partial layer D1 applied by plasma discharge would have a larger minimum thickness. When the outer partial layer D1 is formed of $SiO_2$ as well as when the outer partial layer is formed of silicon nitride, a minimum thickness of 0.6 $\mu$m is proposed for the outer partial layer.

If the method according to the invention is used, the structure seen in FIG. 3 is obtained as far as the first and the second metallization surfaces are concerned, and its surface can optionally be covered in the usual manner with a further non-illustrated insulating layer. If a third or even a fourth insulating layer is provided, a dielectric intermediate layer which is formed of two partial layers D1 and D2 and is generated through the use of the method according to the invention, is also provided between the respective adjacent planar metallization surfaces.

The following advantages are obtained by using the invention:

(a) A very low resulting defect density of the dielectric intermediate layer separating the adjacent planar metallization surfaces is obtained, especially if the upper partial layer D1 is formed of silicon nitride deposited by a plasma discharge. The probability that the two partial layers generated in this manner will have a pinhole or another defect at the same point, which could then cause an unintended conducting connection between the two metallizations A1 and A2 separated by the insulating layer D1 and D2, is very low, according to experience.

(b) The partial layer D2 is formed of SiO$_2$ applied by sputtering and the flattening-out effect on the outside of this partial layer is advantageously noticeable even at very small thicknesses of this partial layer. Furthermore, the advantageous effect thereof, which is directed toward the second metallization A2, is not impaired by the presence of the outer partial layer D1 in spite of its different method of generation by a plasma discharge. For these reasons, substantially greater safety against damage as shown in FIG. 1 is ensured, than is the case with the structures prepared in the conventional manner.

While this advantage is connected with a somewhat higher technical cost as compared to the conventional method, the higher yield and operating reliability of the semiconductor devices obtained, fully justify this fact. In addition, it can be stated that the total thickness of the dielectric intermediate layer D1 and D2 is not greater than the thickness of the dielectric intermediate layer B1 applied by a homogeneous deposition method in the devices manufactured in the customary manner.

The use of the method according to the invention appears particularly advantageous if at the same time, the so-called "double lift-off technology" described in the publication "IEEE/ED-28 no. 5 (May 1981), page 552", is used.

Finally, it should also be mentioned that the metallization which forms the conductor runs A1, A2 and is formed in particular of aluminum, can be applied by vapor deposition or by sputtering-on.

I claim:

1. Method of manufacturing a monolithically integrable circuit, which comprises depositing an SiO$_2$ layer on the surface of a semiconductor substrate containing p-n junctions of the circuit, at least partially covering the SiO$_2$ layer with a first metallization supported by the SiO$_2$ layer and containing conductor runs and electrodes capacitively coupled to the surface of the semiconductor substrate through the SiO$_2$ layer, directly covering the first metallization with a sputtered-on SiO$_2$ insulating layer after the first metallization is completed, covering the sputtered-on SiO$_2$ layer with a further inorganic insulating layer generated by the plasma method, structuring the further inorganic insulating layer and the sputtered-on SiO$_2$ layer, forming cutouts in the further inorganic insulating layer and the sputtered-on SiO$_2$ layer above intended contact locations of the first metallization, applying a second metallization to the surface of the further inorganic insulating layer after completing the first metallization, the sputtered-on SiO$_2$ layer and the further inorganic insulating layer, bringing the second metallization into electrical contact with the contact locations of the first metallization through the cutouts, and forming the second metallization into conductor runs.

2. Method according to claim 1, which comprises forming the further insulating layer of silicon nitride.

3. Method according to claim 1, which comprises forming the further insulating layer of silicon dioxide.

4. Method according to claim 2, which comprises forming the sputtered-on insulating layer at least 0.7 μm thick and the further insulating layer at least 0.6 μm thick.

5. Method according to claim 3, which comprises forming the sputtered-on insulating layer at least 0.7 μm thick and the further insulating layer at least 0.6 μm thick.

* * * * *